(12) United States Patent
Peters et al.

(10) Patent No.: US 6,362,636 B1
(45) Date of Patent: *Mar. 26, 2002

(54) PROBE STATION HAVING MULTIPLE ENCLOSURES

(75) Inventors: Ron A. Peters, Tigard; Leonard A. Hayden, Beaverton; Jeffrey A. Hawkins, Portland; R. Mark Dougherty, Aloha, all of OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/908,218

(22) Filed: Jul. 17, 2001

Related U.S. Application Data

(63) Continuation of application No. 09/451,698, filed on Nov. 30, 1999, now Pat. No. 6,288,557, which is a continuation-in-part of application No. 08/870,335, filed on Jun. 6, 1997, now Pat. No. 6,002,263.

(51) Int. Cl.[7] .................................................. G01R 31/02
(52) U.S. Cl. ..................... 324/754; 324/158.1; 324/761
(58) Field of Search .............................. 324/754, 158.1, 324/701; 333/246

(56) References Cited

U.S. PATENT DOCUMENTS

| | | |
|---|---|---|
| 3,185,927 A | 5/1965 | Margulis et al. |
| 3,333,274 A | 7/1967 | Forcier |
| 3,405,361 A | 10/1968 | Kattner et al. |
| 3,710,251 A | 1/1973 | Hagge et al. |
| 4,115,736 A | 9/1978 | Tracy |
| 4,383,178 A | 5/1983 | Shibata et al. |
| 4,694,245 A | 9/1987 | Frommes |
| 4,731,577 A | 3/1988 | Logan |
| 4,755,746 A | 7/1988 | Mallory et al. |
| 4,757,255 A | 7/1988 | Margozzi |
| 4,758,785 A | 7/1988 | Rath |
| 4,771,234 A | 9/1988 | Cook et al. |
| 4,845,426 A | 7/1989 | Nolan et al. |
| 4,856,904 A | 8/1989 | Akagawa |
| 4,884,026 A | 11/1989 | Hayakawa et al. |
| 5,077,523 A | 12/1991 | Blanz |
| 5,084,671 A | 1/1992 | Miyata et al. |
| 5,220,277 A | 6/1993 | Reitinger |
| 5,266,889 A | 11/1993 | Harwood et al. |
| 5,345,170 A | 9/1994 | Schwindt et al. |
| 5,457,398 A | 10/1995 | Schwindt et al. |
| 5,963,027 A | 10/1999 | Peters |
| 6,002,263 A | 12/1999 | Peters et al. |

FOREIGN PATENT DOCUMENTS

| | | |
|---|---|---|
| DE | 3114466 | 3/1982 |
| EP | 201205 | 12/1986 |
| JP | 1-209380 | 8/1989 |
| JP | 2-022837 | 1/1990 |
| JP | 2-220453 | 9/1990 |
| JP | 4-000732 | 1/1992 |

OTHER PUBLICATIONS

"Model TPO3000 Series Thermochuck® Systems," four-page product note, Temptronic Corporation, Newton, MA (May 1992 or earlier).

"Application Note 1 Controlled Environment Enclosure," two-page application note, Temptronic Corporation, Newton, MA (May 1992 or earlier).

(List continued on next page.)

*Primary Examiner*—Safet Metjahic
*Assistant Examiner*—Jimmy Nguyen
(74) *Attorney, Agent, or Firm*—Chernoff, Vilhauer, McClung & Stenzel

(57) ABSTRACT

A probe station for probing a test device has a chuck element for supporting the test device. An electrically conductive outer shield enclosure at least partially encloses such chuck element to provide EMI shielding therefor. An electrically conductive inner shield enclosure is interposed between and insulated from the outer shield enclosure and the chuck element, and at least partially encloses the chuck element.

1 Claim, 3 Drawing Sheets

OTHER PUBLICATIONS

"Cross Section Signatone S–1240," one–page sketch prepared by Signatone counsel, Signatone, San Jose, CA (Feb. 1988 or earlier per Signatone).

"S–1240," two–page product note, Signatone, San Jose, CA (Feb. 1988 or earlier per Signatone counsel).

Y. Yamamoto, "A Compact Self–Shielding Prober . . . ," IEEE Trans., Inst. and Meas., vol. 38, pp 1088–1093, 1989.

Temptronic's "Guarded" Chuck, one–page note describing guarding system of Temptronic Corporation of Newton, MA, dated Nov. 15, 1989.

Beck & Tomann, "Chip Tester," IBM Technical Disclosure Bulletin, p. 4819 (Jan. 1985).

Article by William Knauer entitled "Fixturing for Low–Current/Low Voltage Parametric Testing," appearing in Evaluation Engineering, (1990) pp. 150–153.

Hewlett–Packard, "Application Note 356–HP 4142 B Modular DC Source/Monitor Practical Applications," (Nov. 1987) pp. 1–4.

Hewlett–Packard, H–P Model 4284A Precision LCR Meter, Operation Manual (Dec. 1991) pp. 2–1, 6–9 and 6–15.

Cascade Microtech, Advanced On–Wafer Device Characterization Using the Summit 10500, (Dec. 1992)

Micromanipulator Company, Inc., "Test Station Accessories," 1983. (month unavailable).

Micromanipulator Company, Inc., "Model 8000 Test Station," 1986. (month unavailable).

Micromanipulator Company, Inc., "Model 8000 Test Station," 1988. (month unavailable).

Micromanipulator Company, Inc., "Probing Stations and Accessories," 1995, pp. 1–12.

Photograph of Micromanipulator Probe Station, 1994.

Applebay, Harry F., Deposition transcript (pp. 61–67) with Exhibits 581 A,B,C describing Flexion AP–1 probe station sold in 1987.

PROBE STATION HAVING MULTIPLE ENCLOSURES

This application is a continuation of application Ser. No. 09/451,698, filed Nov. 30, 1999, now U.S. Pat. No. 6,288, 557 which is a continuation of application Ser. No. 08/870, 335, filed Jun. 6, 1997, now U.S. Pat. No. 6,002,263.

BACKGROUND OF THE INVENTION

The present invention relates to probe stations, commonly known as package or wafer probers, used manually, semi-automatically or fully automatically to test semiconductor devices. More particularly, the invention relates to such probe stations having EMI shielded enclosures for substantially enclosing the test devices, such as those probe stations shown in commonly-owned U.S. Pat. Nos. 5,266,889 and 5,457,398 which are hereby incorporated by reference.

The probe stations shown in the foregoing patents are capable of performing both low-current and high-frequency measurements within a single shielded enclosure. However, as electrical test currents decrease, or as electrical test frequencies increase, the use of merely a single EMI shielding enclosure becomes less adequate. In the most sensitive of measurements, and particularly (although not necessarily) when guarding is employed for low current measurements as described in U.S. Pat. No. 5,457,398, the choice of the shield potential is critical. Reflecting such criticality, the single shield enclosures shown in the foregoing patents have in the past been equipped with selective connectors enabling the shield potential to match that of the measurement instrumentation ground while being isolated from other connectors, or alternatively to be biased by another connector, or to be connected to AC earth ground. Usually the measurement instrumentation ground is preferred since it provides a "quiet" shield ideally having no electrical noise relative to the measurement instrument. However, if the shielding enclosure is exposed to EMI (such as electrostatic noise currents from its external environment), its ideal "quiet" condition is not achieved, resulting in unwanted spurious currents in the chuck assembly guard element and/or the supporting element for the test device. The effect of such currents is particularly harmful to the operation of the guard element, where the spurious currents result in guard potential errors causing leakage currents and resultant signal errors in the chuck element which supports the test device.

For high-frequency measurements, guarding is typically not employed. However, for the most sensitive of measurements, the "quietness" of the shield is still critical. For this reason, it is common practice to construct a fully shielded room, commonly known as a screen room, large enough to contain a probe station with its own separate shield enclosure, test equipment, and several operators. However, screen rooms take up a large amount of space, are expensive to build, and are ineffective with respect to noise sources within the room.

The environmental influences which ordinarily compromise the desired quiet condition of a shield are the motion of external objects at constant potential which cause spurious shield currents due to varying capacitance, and external AC voltages which cause spurious shield currents via constant capacitance. For sensitive measurements, what is needed is a truly quiet shield unaffected by such environmental influences.

Also, to reduce the need for a screen room, and provide a shield unaffected by closely adjacent environmental influences, such quiet shield structure should be compact.

BRIEF SUMMARY OF THE INVENTION

The present invention satisfies the foregoing need by providing a probe station having respective inner and outer conductive shield enclosures insulated from each other, both enclosures at least partially enclosing the chuck assembly element which supports the test device, and also its associated guard element if one is provided. The outer shield enclosure, which is preferably connected either directly or indirectly to AC earth ground, intercepts the external environmental noise, minimizing its effects on the inner shield and on the chuck assembly elements enclosed by the inner shield.

Such inner and outer shield enclosures are preferably built integrally into the probe station and therefore are compact.

The foregoing and other objectives, features, and advantages of the invention will be more readily understood upon consideration of the following detailed description, taken in conjunction with the accompanying drawings.

DETAILED DESCRIPTION OF THE PREFERRED EMBODIMENT

Figure 1:
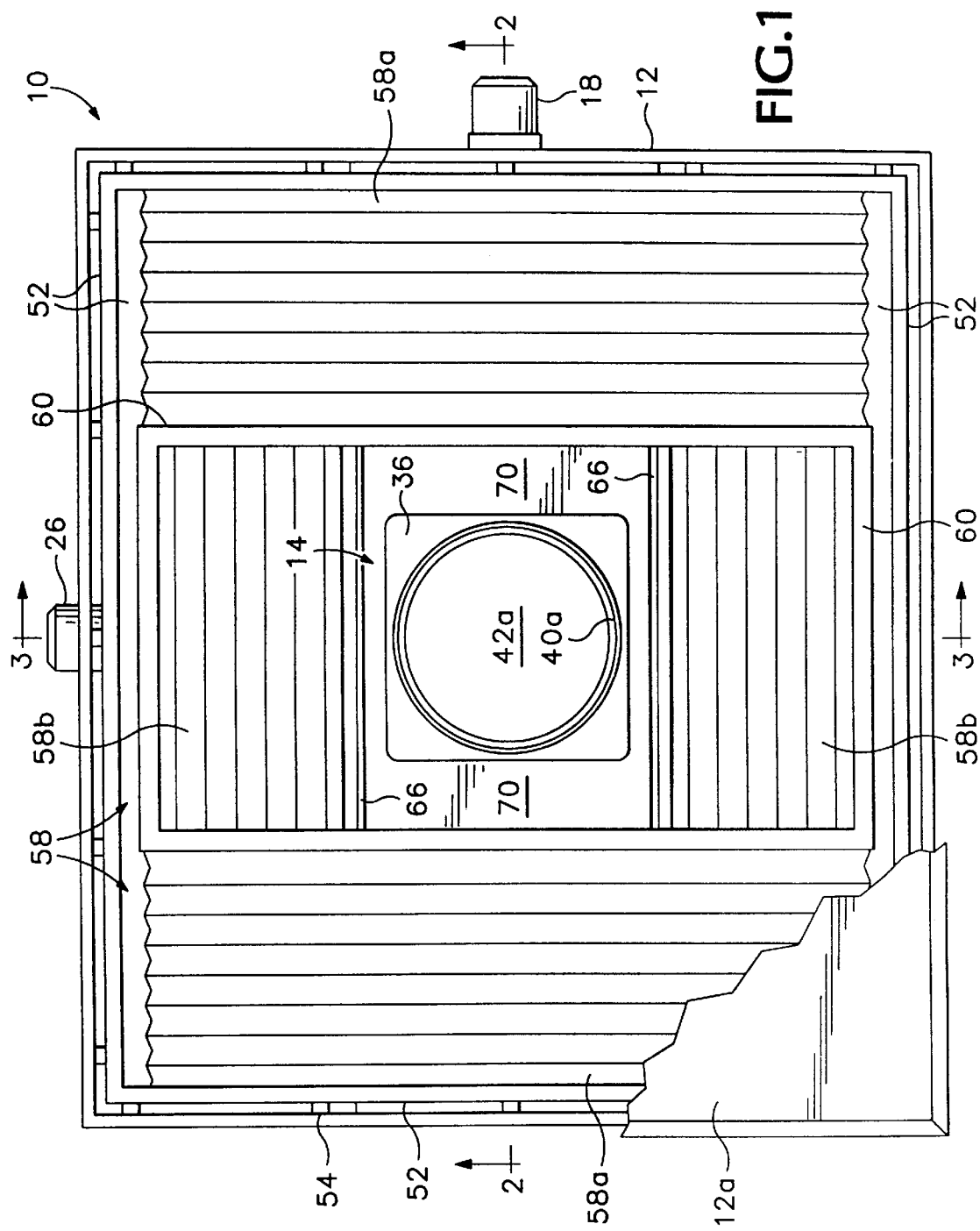
FIG. 1 is a top view of an exemplary probe station in accordance with the present invention, with the top of the station partially removed to show interior structure.

An exemplary embodiment of a probe station in accordance with the present invention, indicated generally as 10 in the figures, has an electrically conductive outer enclosure 12 including a conductive raisable hinged lid 12a electrically connected thereto. A chuck assembly 14 for supporting a test device is laterally positionable by a chuck positioner assembly having orthogonally arranged lateral X-axis and Y-axis positioners. A lateral X-axis positioner 16 has a laterally extending positioning screw (not shown) driven by an electric motor 18. The X-axis positioner 16 is partially enclosed by a conductive housing 16a, and optionally also by flexible pleated rubber boots 16b for accommodating positioning movements while preventing the entry and escape of dirt particles. The conductive housing 16a is insulated from the outer enclosure 12 by respective dielectric anodized coatings on both the exterior of the housing 16a and the interior of the enclosure 12, and is indirectly connected electrically to AC earth ground by means of conventional motor cabling and a grounded motor power supply (not shown), represented schematically in FIG. 2 by a high-impedance electrical path 22. The X-axis positioner 16 selectively moves a Y-axis positioner 24, oriented perpendicularly to the X-axis positioner 16, along the X-axis.

Figure 3:
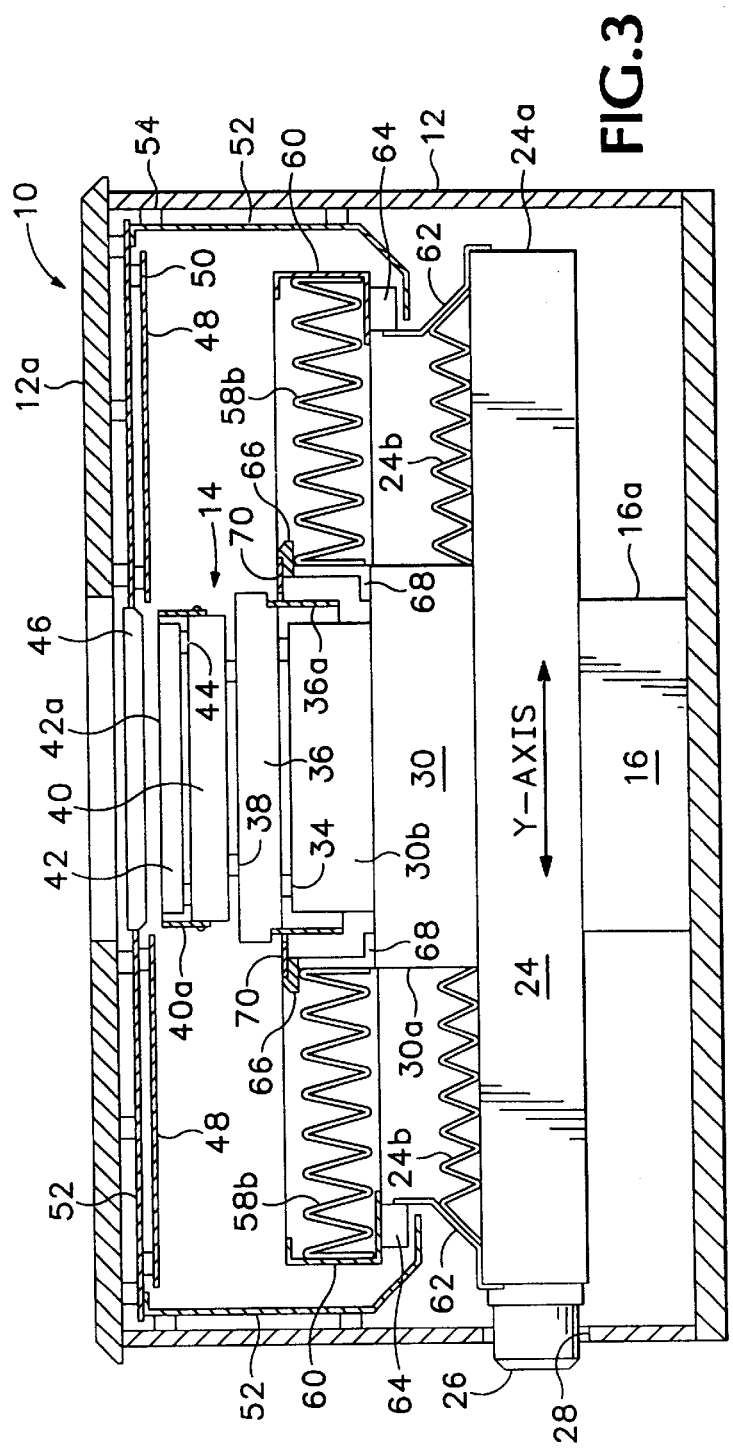
FIG. 3 is a partially sectional, partially schematic view taken along line 3—3 of FIG. 1.

The lateral Y-axis positioner 24 is constructed similarly to the X-axis positioner 16, and includes an outer conductive housing 24a with optional flexible pleated rubber boots 24b. The conductive housing 24a is electrically connected to the housing 16a of the X-axis positioner. The motor 26 of the Y-axis positioner 24 extends through a horizontal slot 28 (FIG. 3) in the side of the enclosure 12, thereby permitting it to be moved freely along the X-axis by the X-axis positioner 16. Alternatively, a larger enclosure 12 could eliminate the slot 28.

A conventional Z-axis positioner 30, having a conductive housing 30a electrically connected to the housing 24a, is movable along the Y-axis by the Y-axis positioner 24. The Z-axis positioner 30 includes respective internal electric motors (not shown) which selectively reciprocate a plunger assembly 30b vertically and rotate it through a limited range about a vertical axis in a known manner.

The outer conductive enclosure 12 is connected by a low-impedance path 32 (FIG. 2) directly to AC ground. Collectively, the outer enclosure 12, 12a and the positioner housings 16a, 24a, and 30a cooperate to provide an electrically conductive outer shield enclosure which separates the remainder of the probe station from environmental noise sources, whether located externally of the enclosure 12 or internally thereof inside the positioner housings. Such noise sources include the electric motors 18 and 26, and those motors within the Z-axis positioner 30, as well as other electrical components such as cables, thermal heaters, encoders, switches, sensors, etc.

Mounted atop the plunger assembly 30b and electrically insulated therefrom by dielectric spacers 34 is a square-shaped conductive chuck shield 36 having a downwardly depending conductive cylindrical skirt 36a. Mounted atop the chuck shield 36 and electrically insulated therefrom by dielectric spacers 38 is a conductive chuck guard element 40, which includes a peripheral cylindrical conductive guard skirt 40a. The guard skirt 40a peripherally surrounds a conductive chuck element 42 in spaced relation thereto. The chuck element 42 is insulated from the guard element 40 and guard skirt 40a by dielectric spacers 44 and has a supporting surface 42a thereon for supporting a test device during probing. Probes (not shown) are mounted on a probe ring 46, or other suitable type of probe holder, for contacting the test device when the Z-axis positioner 30 raises the supporting surface 42a upwardly into probing position.

Figure 2:
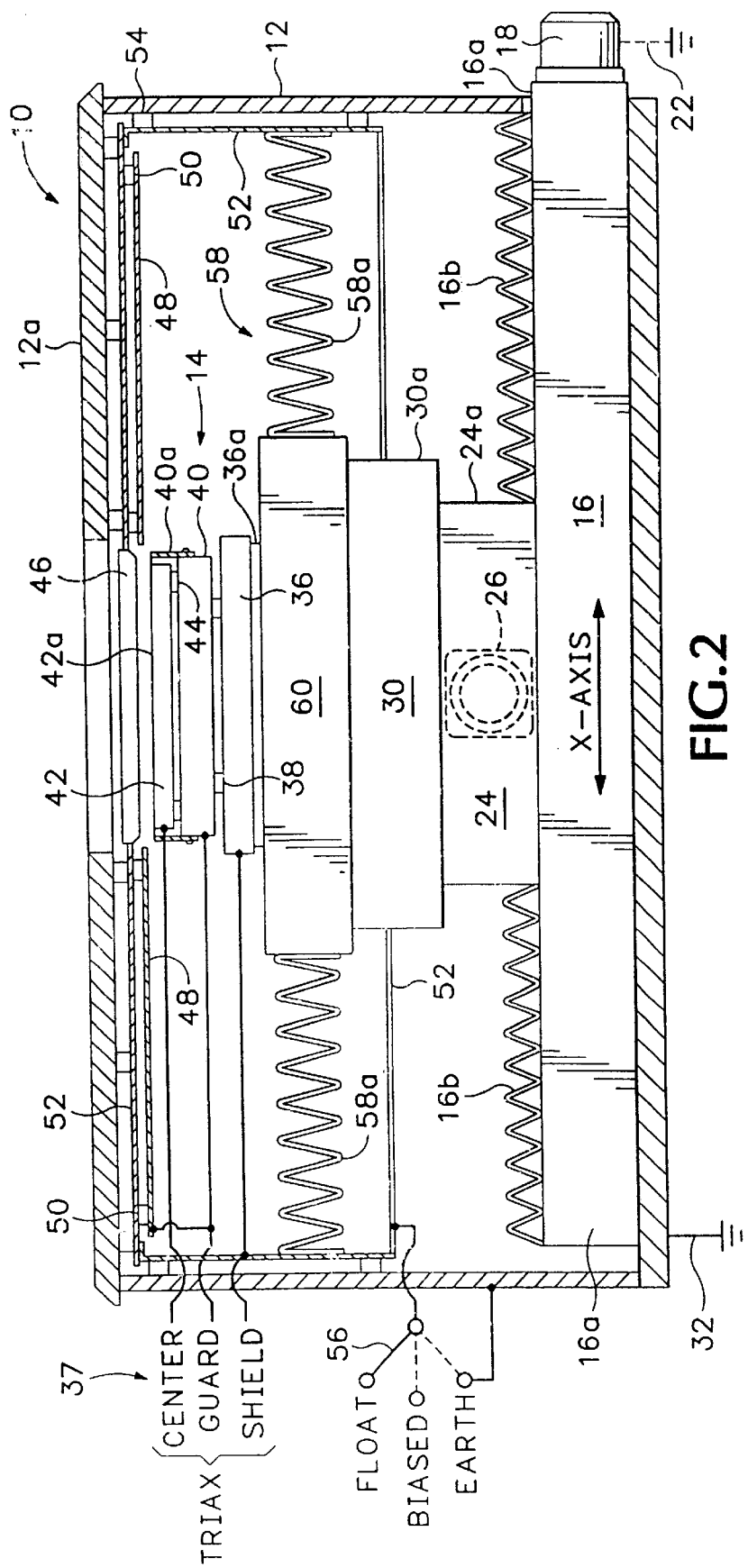
FIG. 2 is a partially sectional, partially schematic view taken along line 2—2 of FIG. 1.

As shown schematically in FIG. 2, the chuck shield 36 is electrically connected to the shield of a triaxial cable 37 interconnected with the measurement instrumentation. The guard element 40, together with the guard skirt 40a, is connected to the guard conductor of the triaxial cable, and the chuck element 42 is connected to the center or signal conductor of the triaxial cable 37. Preferably a further guard element in the form of a conductive plate 48, also electrically connected to the guard conductor of the triaxial cable and insulated from the remainder of the probe station by dielectric spacers 50, is suspended in opposed relationship to the supporting surface 42a. The conductive plate 48 also provides a connection to a guard element on the bottom of a probe card (not shown). Further details of the electrical connections, and of the dielectric spacers utilized to insulate the chuck elements from each other, are explained in U.S. Pat. No. 5,457,398 which is incorporated herein by reference. As explained in such patent, the connections to the chuck elements 40 and 42 cause such elements to have substantially equal potentials to minimize leakage currents there between.

An electrically conductive inner shield enclosure 52, which also preferably acts as the probe station's environment control enclosure not only for purposes of EMI shielding but also for purposes of maintaining a dry and/or dark environment, is mounted by dielectric spacers 54 to the interior of the outer enclosure 12 so as to be interposed between and insulated from the outer enclosure 12 and the chuck elements 40 and 42. Like the chuck shield 36, the enclosure 52 is connected to the shield of the triaxial cable 37 associated with the measurement instrumentation. A selective connector mechanism, schematically illustrated as a three-way switch 56 in FIG. 2, enables respective different potentials to be selectively established on the enclosure 52. Normally the selective mechanism 56 would be in the "float" position whereby the potential of the enclosure 52 depends on the triaxial shield associated with the measurement instrumentation. However the enclosure 52 can alternatively be electrically biased by the selective connector mechanism 56, or interconnected with the outer enclosure 12 if desired for particular applications. In the normal situation where the inner enclosure 52 is not electrically connected to the outer enclosure 12, the outer shield components 12, 12a, 16a, 24a, and 30a protect the inner shield 52 from external noise sources, so that the inner shield in turn can minimize noise-induced spurious currents affecting the chuck elements 40 and/or 42 and thereby maximize the accuracy of the test measurements.

Movement of the chuck assembly 14 laterally by the X-axis and Y-axis positioners 16 and 24, respectively, is accomplished with the Z-axis positioner retracted in order to position the test device with respect to the probe or probes. During such movement, the environmental integrity of the inner enclosure 52 is maintained by means of an electrically conductive flexible wall assembly indicated generally as 58. The wall assembly 58 includes a pair of flexibly extensible and retractable pleated wall elements 58a which are extensible and retractable along the X-axis, and a further pair of such wall elements 58b which are flexibly extensible and retractable along the Y-axis. The outermost ends of the wall elements 58a are electrically connected to the inner surfaces of the inner enclosure 52 by screws (not shown). The innermost ends of the wall elements 58a are similarly connected to a rectangular metal frame 60 supported by the Y-axis positioner housing 24a by means of brackets 62 (FIG. 3) and dielectric spacers 64 which insulate the frame 60 from the Y-axis positioner housing 24a. The outermost ends of the flexible wall elements 58b, on the other hand, are electrically connected to the inner surfaces of the ends of the frame 60 by screws (not shown), while their innermost ends are similarly connected to respective conductive bars 66 insulatively supported by dielectric brackets 68 atop the Z-axis positioner housing 30a. Conductive plates 70 are electrically connected to the bars 66 and surround the chuck shield skirt 36a in spaced relation thereto.

As the X-axis positioner 16 moves the Y-axis positioner 24 and chuck assembly along the X-axis, it likewise moves the frame 60 and its enclosed wall elements 58b along the X-axis as the wall elements 58a extend and retract. Conversely, as the Y-axis positioner 24 moves the Z-axis positioner and chuck assembly along the Y-axis, the wall elements 58b similarly extend and retract along the Y-axis.

Figure 4:
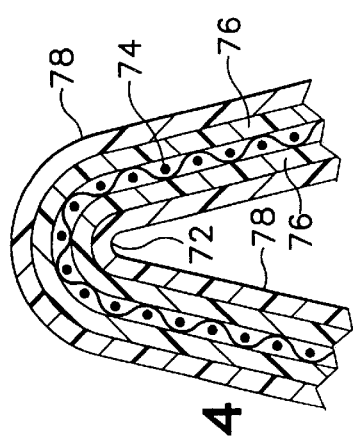
FIG. 4 is an enlarged sectional view of a portion of a flexible wall element of the embodiment of FIG. 1.

With reference to FIG. 4, a cross-section of an exemplary pleat 72 of the flexible wall elements 58a and 58b is shown. The electrically conductive core 74 of the pleated material is a fine mesh polyester, chemically coated with copper and nickel. The core 74 is sandwiched between respective layers 76 which are nylon fabric with a PVC stiffener. The respective layers 76 in turn are covered by respective outer layers 78 of polyurethane. The pleated material is preferably fluid-impervious and opaque so that the inner enclosure 52 can serve as a dry and/or dark environment control chamber, as well as an EMI shield. However, if the inner enclosure 52 were merely intended to serve as a shield, the pleated material need not be fluid-impervious or opaque.

Conversely, if the inner enclosure 52 were intended to serve merely as an environment control chamber for dry and/or dark purposes, without EMI shielding, the pleated material's conductive core 74 could be eliminated. Also, alternative pleated materials of other compositions, such as thin, highly flexible stainless steel or other all-metal sheet material, could be used.

Figure 5:
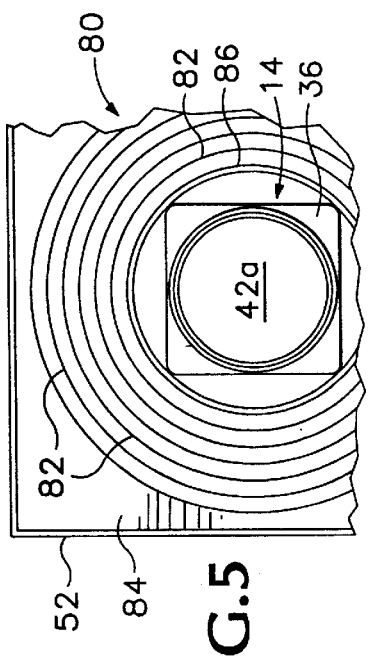
FIG. 5 is a partial top view of an alternative embodiment of the invention.

As a further alternative, a one-piece flexible wall assembly 80 (FIG. 5) having circular or oblate curved rings of pleats 82 surrounding the chuck assembly 14 could be provided in place of the wall assembly 58 to permit flexible extension and retraction in radial X and Y directions. The outer extremity of the wall assembly 80 is electrically connected by a curved conductive frame 84 to the inner shield enclosure 52. The inner extremity of the wall assembly 80 is supported by a circular conductive ring 86, and an underlying circular dielectric bracket (not shown) comparable to bracket 68, upon the Z-axis positioner housing 30a.

As a further alternative, the inner enclosure 52 could utilize conductive or nonconductive sliding plates, such as those shown in U.S. Pat. No. 5,457,398 incorporated herein by reference, in place of the flexible wall assembly 58 if the more desirable characteristics of the flexible wall assembly are not needed. As a still further alternative, unpleated flexibly extensible and retractable material could be used instead of pleated material in the wall assembly 58.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe station for probing a test device, said probe station comprising:

(a) a chuck assembly having a chuck assembly element with a supporting surface for supporting said test device during probing thereof;

(b) an electrically conductive outer enclosure at least partially enclosing said supporting surface and insulated therefrom;

(c) an electrically conductive inner enclosure interposed between and insulated from said enclosure and said supporting surface, and at least partially enclosing said supporting surface;

(d) respective electrical conductors connected to said supporting surface and said inner enclosure, respectively, causing said inner enclosure and said supporting surface to have respective potentials independent of each other; and (e) a selective connector, either interconnecting or, alternatively, disconnecting said inner enclosure and said outer enclosure electrically with respect to each other.

* * * * *